United States Patent [19]

Pan et al.

[11] Patent Number: 5,667,629

[45] Date of Patent: Sep. 16, 1997

[54] METHOD AND APPARATUS FOR DETERMINATION OF THE END POINT IN CHEMICAL MECHANICAL POLISHING

[75] Inventors: Yang Pan, Pine Grove; Jiazhen Zheng, Whye Lane, both of Singapore

[73] Assignee: Chartered Semiconductor Manufactuing Pte, Ltd., Singapore, Singapore

[21] Appl. No.: 668,993

[22] Filed: Jun. 21, 1996

[51] Int. Cl.$^6$ .................... H01L 21/66; H01L 21/302
[52] U.S. Cl. .................... 438/13; 216/86; 216/89; 216/88; 451/41; 438/17; 438/692; 156/345
[58] Field of Search .................... 156/627.1, 636.1, 156/645.1, 345; 216/38, 86, 89

[56] References Cited

U.S. PATENT DOCUMENTS

| | | | |
|---|---|---|---|
| 4,793,895 | 12/1988 | Kaanta et al. | 156/627 |
| 5,036,015 | 7/1991 | Sandhu et al. | 437/8 |
| 5,308,438 | 5/1994 | Cote et al. | 156/636 |
| 5,337,015 | 8/1994 | Lustig et al. | 324/671 |
| 5,449,638 | 9/1995 | Hong et al. | 437/61 |
| 5,492,594 | 2/1996 | Burke et al. | 216/86 |
| 5,499,733 | 3/1996 | Litvak | 216/38 |

*Primary Examiner*—Nam Nguyen
*Assistant Examiner*—Michael E. Adjodha
*Attorney, Agent, or Firm*—George O. Saile; Larry J. Prescott

[57] ABSTRACT

An apparatus and method for determination of the endpoint for chemical mechanical polishing of a layer of dielectric material formed on an integrated circuit wafer. A first voltage is generated which is proportional to the current supplying electrical power to the electric motor driving the polishing mechanism. The current is proportional to the rate of removal of dielectric material by the polishing process. The integral over time of the first voltage, which is proportional to the amount of dielectric material removed, is generated by an integrator circuit. A comparator circuit compares the integral over time of the first voltage to a reference voltage. The reference voltage is proportional to the initial thickness of the dielectric material and is a function of the age of the polishing pad. When the integral over time of the first voltage is less than the reference voltage the polishing continues. When the integral over time of the first voltage is equal to the reference voltage or becomes larger than the reference voltage the polishing is stopped.

2 Claims, 3 Drawing Sheets

5,667,629

METHOD AND APPARATUS FOR DETERMINATION OF THE END POINT IN CHEMICAL MECHANICAL POLISHING

BACKGROUND OF THE INVENTION

(1) Field of the Invention

This invention relates to the determination of the endpoint in chemical mechanical polishing, CMP, and more specifically to integrating a current which is proportional to the rate of removal of the film being polished and stopping the polishing when a pre-determined amount of the film has been removed.

(2) Description of the Related Art

As the use of chemical mechanical polishing becomes more widely used in integrated circuit manufacture it becomes increasingly important to find improved methods for determination of the endpoint of the polishing.

U.S. Pat. No. 5,492,594 to Burke et al. describes a tool which uses a plurality of electrodes in an electrolyte bath to determine the thickness of dielectric remaining on the surface of the wafer being polished.

The invention of this Patent Application generates the integral over time of a current proportional to the rate of removal of a dielectric layer being polished. In this way the amount of dielectric layer removed is determined. The endpoint is reached when a predetermined amount of the dielectric layer has been removed.

SUMMARY OF THE INVENTION

Chemical Mechanical Polishing, CMP, is becoming more widely used in the manufacture of integrated circuit wafers as a means of planarizing dielectric layers formed on the integrated circuit wafers. The dielectric layers are typically formed over devices formed in the integrated circuit wafers and metal electrodes, and/or other features, formed on the surface of the integrated circuit wafer. CMP comprises the use of a polishing mechanism, a polishing pad attached to the polishing mechanism, an abrasive slurry, and relative motion between the polishing pad and the integrated circuit wafer to polish the surface of the dielectric layer and achieve a smooth surface.

One of the problems encountered in using CMP for planarizing dielectric layers on integrated circuit wafers is determination of the end point of the polishing step. If the polishing is continued for too long a time the polishing can proceed through the dielectric layer and into the metal electrodes or other features covered by the dielectric layer and damage them. Frequent inspection of the wafer being polished can prevent over polishing and damage to metal electrodes or other features but this is time consuming and requires frequent interruptions in the polishing operation.

It is a principal objective of this invention to provide a method for determining the end point in chemical mechanical polishing that avoids the problems described in the preceding paragraphs.

It is another principal objective of this invention to provide an apparatus for determining the end point in chemical mechanical polishing that avoids the problems described in the preceding paragraphs.

These objectives are achieved by measuring the current which supplies the power to the electric motor driving the chemical mechanical polishing mechanism. The current is proportional to the power delivered to the electric motor, proportional to the friction between the polishing pad and the layer of dielectric material being polished, and thereby proportional to the rate of removal of dielectric material from the layer of dielectric material being polished. A first voltage, proportional to this current, is then generated and fed to the input of an integrator circuit. The output of the integrator circuit is then a voltage which is proportional to the amount of dielectric material which has been removed.

The initial thickness of the layer of dielectric material to be polished is measured and a reference voltage is generated which is proportional to this initial thickness of the dielectric layer multiplied by a quantity which is a function of the age of the polishing pad. The reference voltage and the output of the integrator circuit are fed to the two inputs of a comparator circuit so that the output of the comparator circuit is the reference voltage subtracted from the output of the integrator circuit. As long as the voltage at the output of the integrator circuit is less than the reference voltage, and the output of the comparator circuit is negative, the polishing continues. When the voltage at the output of the integrator circuit is equal to or exceeds the reference voltage, and the output of the comparator circuit is zero or positive, the polishing is stopped.

The output of the integrator circuit is a measure of the amount of dielectric material removed by the polishing. The reference voltage is used to determine how much dielectric is to be removed before the polishing operation is automatically stopped.

DESCRIPTION OF THE PREFERRED EMBODIMENTS

Figure 1:
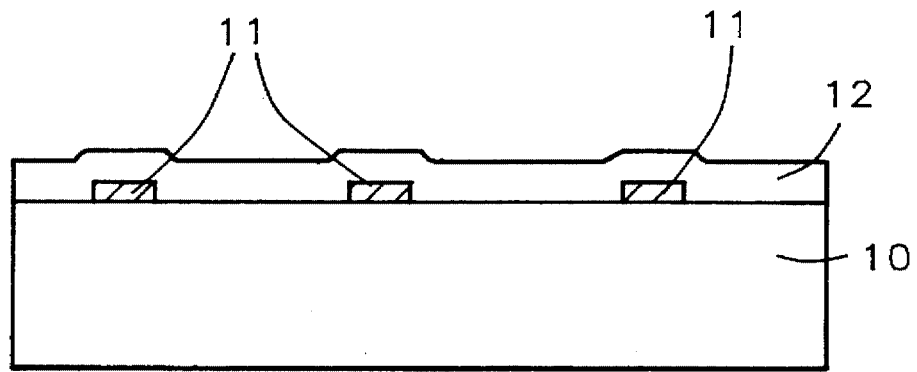
FIG. 1 shows a cross section view of an integrated circuit wafer having a layer of dielectric material to be polished.
Figure 2:
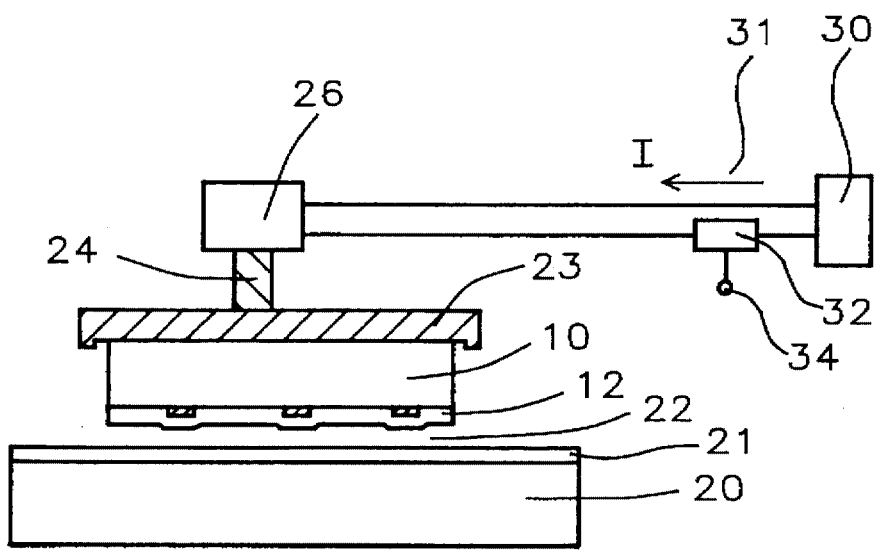
FIG. 2 shows a diagram of a polishing mechanism.
Figure 3:
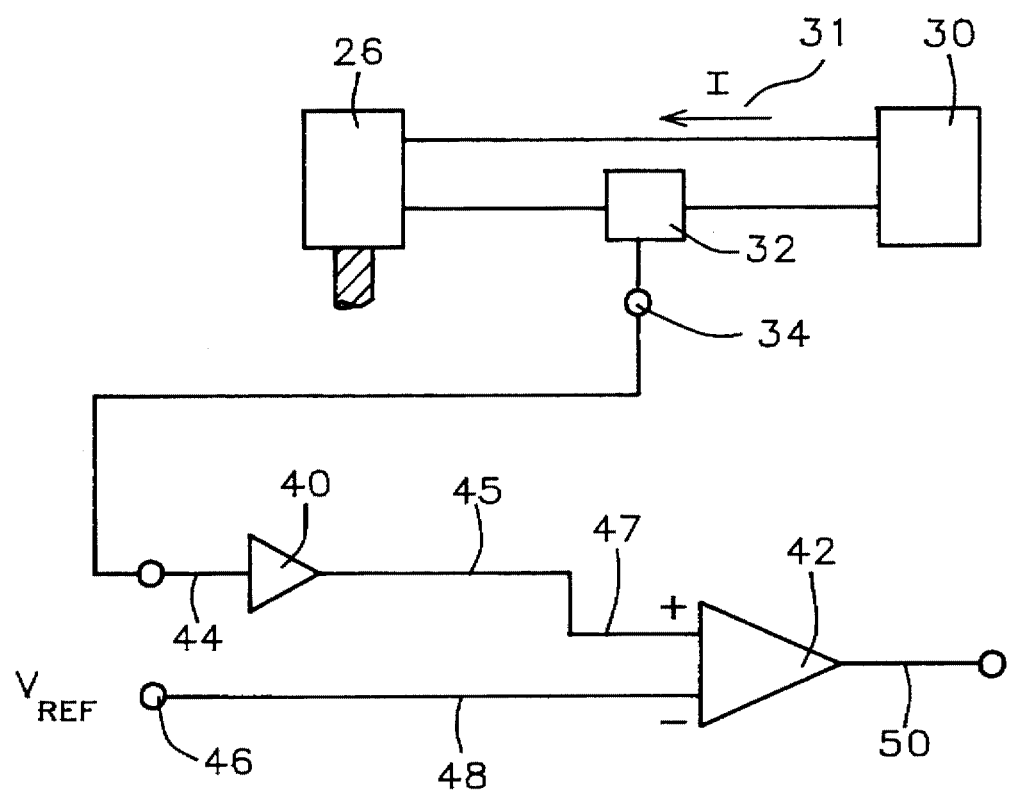
FIG. 3 shows a block diagram of an integrator circuit connected to a comparator circuit.

Refer now to FIGS. 1-3, there is shown the apparatus for automatic determination of the end point of a chemical mechanical polishing, CMP, process. FIG. 1 shows a cross section view of an integrated circuit wafer 10 having devices formed therein, not shown, electrodes and/or other features 11 formed thereon, and a layer of dielectric material 12 formed on the integrated circuit wafer 10 over the electrodes and/or other features 11. In the CMP process the layer of dielectric material 12 is to be planarized by polishing the layer of dielectric material without damaging the electrodes or other features 11.

FIG. 2 shows a diagram of the polishing mechanism of the apparatus for end point determination of this invention. The integrated circuit wafer 10 is attached to a wafer holder 23, such as a vacuum chuck. A polishing pad 21 is attached to a polishing mechanism 20, such a polishing wheel. The integrated circuit wafer holder 23 and the polishing mechanism 20 are disposed so as to bring the dielectric layer 12 into contact with the polishing pad 21 with an abrasive slurry 22, such as a slurry containing $Al_2O_3$ particles, disposed between them. An electric motor 26 is mechanically coupled to the integrated circuit wafer holder 23, the polishing mechanism 20, or both by means of a mechanical connection 24 and produces relative motion between the layer of dielectric material 22 and the polishing pad 21. FIG. 2 shows the electric motor 26 mechanically coupled to the integrated circuit holder 23 only, however those skilled in the art will readily recognize that the mechanical coupling could be between the electric motor 26 and the polishing mechanism 20 only, or between the electric motor 26 and both the integrated circuit holder 23 and the polishing mechanism 20.

As shown in FIG. 2 an electrical power source 30 is electrically connected to the electric motor 26 and supplies an electrical current 31 to the electric motor 26. A sensing circuit 32 which generates a voltage at an output terminal 34 which is proportional to the current 31 is connected between the electrical power supply 30 and the electric motor 26. The current 31 to the electric motor 26, and consequently the voltage at the output terminal 34 of the sensing circuit 32, is proportional to the power supplied to the electric motor 26 which is proportional to the friction between the polishing pad 21 and the layer of dielectric material 22. The current 31, then, is proportional to the rate at which the polishing removes dielectric material from the layer of dielectric material 12 and the integral over time of the current 31 is proportional to the amount of dielectric material removed from the layer of dielectric material 12.

FIG. 3 shows the power supply 30, the electric motor 26, and the sensing circuit 32 of the polishing mechanism, described above and shown in FIG. 2, and a block diagram of the circuit for end point determination for the CMP process. The circuit for end point determination comprises an integrator circuit 40 having an input 44 and an output 45 and a comparator circuit 42 having a first input 47, a second input 48, and an output 50. The voltage at the output 45 of the integrator circuit 40 is equal to the integral over time of the voltage at the input 44 of the integrator circuit 40. The voltage at the output 50 of the comparator circuit 42 is equal to the voltage at the second input 48 of the comparator circuit 42 subtracted from the voltage at the first input 47 of the integrator circuit 42. The output 45 of the integrator circuit 40 is connected to the first input 47 of the comparator circuit 42. The second input 48 of the comparator circuit 42 is connected to a reference voltage 46 source. The voltage at the output 50 of the comparator circuit 42 is negative when the voltage at the output 45 of the integrator circuit 40 is less than the reference voltage 46, zero when the voltage at the output 45 of the integrator circuit 40 is equal to the reference voltage 46, and positive when the voltage at the output 45 of the integrator circuit 40 is greater than the reference voltage 46.

As shown in FIG. 3 the voltage at the output terminal 34 of the sensing circuit 32, which is proportional to the current 31 supplying power to the electric motor 26 and is also proportional to the rate of removal of dielectric material from the layer of dielectric material during chemical mechanical polishing, is connected to the input 44 of the integrator circuit 40. The voltage at the output 45 of the integrator circuit 40 is the time integral of the voltage at the input 44 of the integrator circuit and is proportional to the amount of dielectric material removed by the chemical mechanical polishing.

The reference voltage determines the end point of the polishing process. As long as the reference voltage is greater than the voltage at the output 45 of the integrator circuit 40 the voltage at the output 50 of the comparator circuit 42 is negative and polishing continues. When the voltage at the output 45 of the integrator circuit 40 becomes equal to or greater than the reference voltage the voltage at the output 50 of the comparator circuit 42 becomes zero or positive and the polishing process is stopped by separating the polishing pad from the layer of dielectric material.

In order to determine the reference voltage the initial thickness of the layer of dielectric material and the age of the polishing pad are determined. The reference voltage is then chosen to be proportional to the initial thickness of the layer of dielectric material multiplied by a quantity related to the age of the polishing pad. The reference voltage determines the amount of dielectric material removed in the polishing process and the polishing is automatically stopped when the pre-determined amount of dielectric material has been removed. In this example the layer of dielectric material has an initial thickness of between about 10,000 and 15,000 Angstroms and the polishing removes between about 50% and 75% of the initial dielectric layer thickness.

Figure 4:
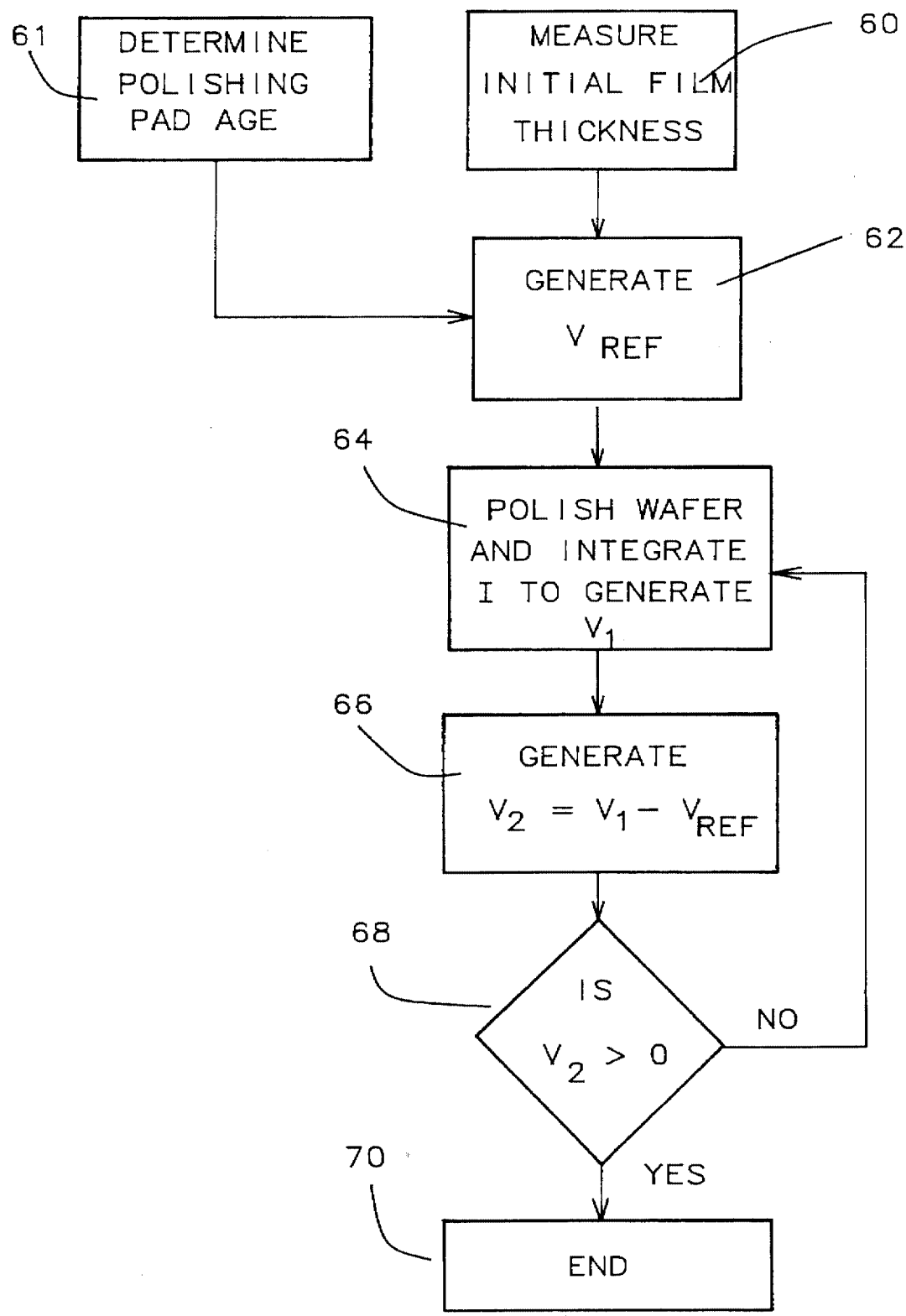
FIG. 4 shows a flow diagram of the method used for automatic end point determination.

Refer now to FIG. 4, there is shown a flow diagram for a method of end point determination for chemical mechanical polishing. First the initial thickness of the layer of dielectric material to be polished is measured 60 and the age of the polishing pad is determined 61. Then the reference voltage is generated 62 so that the reference voltage is proportional to the initial thickness of the layer of dielectric material multiplied by a quantity related to the age of the polishing pad. Next 64 the polishing of the layer of dielectric material is begun and a first voltage is produced at the output of the integrator circuit, as described above. As described above the output of the integrator circuit is proportional to the current supplying the electric motor and is also proportional to the amount of dielectric material removed.

Next 66 the comparator circuit, described above, is used to generate a second voltage which is equal to the reference voltage subtracted from the first voltage. Then 68 the sign of the second voltage is determined. If the second voltage is positive the polishing of the layer of dielectric material continues 64. If the second voltage is zero or negative the polishing process is terminated 70.

While the invention has been particularly shown and described with reference to the preferred embodiments thereof, it will be understood by those skilled in the art that various changes in form and details may be made without departing from the spirit and scope of the invention.

What is claimed is:

1. A method of end point determination for chemical mechanical polishing, comprising the steps of:

providing an integrated circuit wafer having a layer of dielectric material formed thereon wherein said layer of dielectric material has an initial thickness;

providing a means for holding said integrated circuit wafer;

providing a polishing mechanism having a polishing pad;

providing an electrical power source;

providing an electric motor having an input current and electrical connections to said electrical power source wherein said input current is proportional to the electrical power supplied by said electrical power source to said electric motor and said electric motor causes relative motion between said polishing pad and said layer of dielectric material formed on said integrated circuit wafer;

polishing said layer of dielectric material formed on said integrated circuit wafer by means of bringing together said integrated circuit wafer and said polishing mechanism so that said polishing pad contacts said layer of dielectric material whereby said polishing pad removes part of said layer of dielectric material formed on said integrated circuit wafer at a removal rate and said electric current is proportional to said removal rate;

providing a means for generating a first voltage wherein said first voltage is proportional to said current and thereby proportional to said removal rate;

providing an integrator circuit having an input and an output wherein the voltage at the output of said integrator circuit is the integral over time of the voltage at the input of said integrator circuit;

connecting said first voltage to said input of said integrator circuit whereby said voltage at said output of said integrator circuit is the integral over time of said first voltage and thereby proportional to the amount of said layer of dielectric material removed;

providing a comparator circuit having a first input, a second input, and an output wherein the voltage at said output of said comparator circuit is equal to the voltage at said second input of said comparator circuit subtracted from the voltage at said first input of said comparator circuit;

connecting the output of said integrator circuit to said first input of said comparator circuit;

determining said initial thickness of said layer of dielectric material;

determining the age of said polishing pad;

determining a second voltage level wherein said second voltage level is proportional to said initial thickness of said layer of dielectric material multiplied by a quantity related to said age of said polishing pad;

generating a reference voltage equal to said second voltage level;

connecting said reference voltage to said second input of said comparator circuit;

determining if said voltage at said output of said comparator circuit is positive, negative, or zero;

continuing said polishing of said dielectric material formed on said integrated circuit wafer if said voltage at said output of said comparator circuit is negative; and stopping said polishing of said dielectric material formed on said integrated circuit wafer by means of separating said layer of dielectric material formed on said integrated circuit wafer and said polishing pad if said voltage at said output of said comparator circuit is zero or positive.

2. An apparatus for end point determination in chemical mechanical polishing, comprising:

means for holding said integrated circuit wafer having a layer of dielectric material formed thereon wherein said layer of dielectric material has an initial thickness;

a polishing mechanism having a polishing pad;

an electrical power source;

an electric motor having an input current and electrical connections to said electrical power source wherein said input current is proportional to the electrical power supplied by said electrical power source to said electric motor and said electric motor causes relative motion between said polishing pad and said layer of dielectric material formed on said integrated circuit wafer;

means of bringing together said integrated circuit wafer and said polishing mechanism so that said polishing pad contacts said layer of dielectric material whereby said polishing pad removes part of said layer of dielectric material formed on said integrated circuit wafer at a removal rate and said electric current is proportional to said removal rate;

means for generating a first voltage wherein said first voltage is proportional to said current and thereby proportional to said removal rate;

an integrator circuit having an input and an output wherein the voltage at said output of said integrator circuit is the integral over time of the voltage at said input of said integrator circuit;

a first electrical connection between said first voltage and said input of said integrator circuit whereby said voltage at said output of said integrator circuit is the integral over time of said first voltage and thereby proportional to the amount of said layer of dielectric material removed;

a comparator circuit having a first input, a second input, and an output wherein the voltage at said output of said comparator circuit is equal to the voltage at said second input of said comparator circuit subtracted from the voltage at said first input of said comparator circuit;

a second electrical connection between said output of said integrator circuit and said first input of said comparator circuit;

means for determining said initial thickness of said layer of dielectric material;

means for determining the age of said polishing pad;

means for determining a second voltage level wherein said second voltage level is proportional to said initial thickness of said layer of dielectric material multiplied by a quantity related to said age of said polishing pad;

means for generating a reference voltage equal to said second voltage level;

a third electrical connection between said reference voltage and said second input of said comparator circuit;

means to determine if said voltage at said output of said comparator circuit is positive, negative, or zero;

means to continue said polishing of said dielectric material formed on said integrated circuit wafer if said voltage at said output of said comparator circuit is negative; and means to stop said polishing of said dielectric material formed on said integrated circuit wafer by separating said layer of dielectric material formed on said integrated circuit wafer and said polishing pad if said voltage at said output of said comparator circuit is zero or positive.

\* \* \* \* \*